United States Patent [19]
Watkins et al.

[11] Patent Number: 5,545,593
[45] Date of Patent: Aug. 13, 1996

[54] METHOD OF ALIGNING LAYERS IN AN INTEGRATED CIRCUIT DEVICE

[75] Inventors: David C. Watkins; Lowell M. Bramer; Christopher F. Gerling, all of Houston, Tex.

[73] Assignee: Texas Instruments Incorporated, Dallas, Tex.

[21] Appl. No.: 129,812

[22] Filed: Sep. 30, 1993

[51] Int. Cl.$^6$ ............................................... H01L 21/463
[52] U.S. Cl. .................................. 437/225; 437/924
[58] Field of Search ........................... 437/225, 924; 148/DIG. 102; 257/797; 427/96, 259, 272, 555

[56] References Cited

U.S. PATENT DOCUMENTS

| | | | |
|---|---|---|---|
| 5,260,599 | 11/1993 | Ponse et al. | 257/620 |
| 5,316,984 | 5/1994 | Leourx | 437/250 |

FOREIGN PATENT DOCUMENTS

| | | | |
|---|---|---|---|
| 4210774 | 10/1992 | Germany | 437/924 |
| 0092527 | 5/1984 | Japan | 437/924 |

OTHER PUBLICATIONS

IBM Technical Disclosure Bulletin vol. 31 No. 4 (Sep. 1988). "Digilized Box-in-a-Box Alignment Veriers For Measuring Accuracy of Overlays . . .".

*Primary Examiner*—George Fourson
*Assistant Examiner*—C. Everhart
*Attorney, Agent, or Firm*—William W. Holloway; Lawrence J. Bassuk; Richard L. Donaldson

[57] ABSTRACT

A method of aligning layers in an integrated circuit device includes associating an alignment target (10, 50) with each layer. Each alignment target (10, 50) has multiple edges created through a boxed frame configuration (16, 18). During semiconductor device fabrication, each alignment target (10, 50) is formed into an alignment structure (200) on the semiconductor wafer. For correspondingly aligned layers, one alignment target of one layer falls within the alignment target of a correspondingly aligned layer within the alignment structure (200). The edges of each alignment target (10, 50) are scanned to determine a center point for each alignment target (10, 50). The layers of the corresponding alignment targets (10, 50) are aligned if the center points calculated from the scanning process performed on the edges of each alignment target coincide along x-axis and y-axis planes.

12 Claims, 3 Drawing Sheets

METHOD OF ALIGNING LAYERS IN AN INTEGRATED CIRCUIT DEVICE

TECHNICAL FIELD OF THE INVENTION

The present invention relates in general to semiconductor device fabrication processes and more particularly to a method of aligning layers in an integrated circuit device.

BACKGROUND OF THE INVENTION

In semiconductor device fabrication processes, different layers are formed on each other to create the desired integrated circuit device. In order that connections can be made for proper device operation, each layer should be properly aligned with another corresponding layer. In conventional alignment procedures, vernier marks were associated with each layer so that a fabrication operator could manually align each layer based on the position of corresponding vernier marks. However, imprecise human eye alignment techniques resulted in a great deal of alignment errors during device fabrication.

Scanning techniques were developed to increase the accuracy of layer alignment by measuring certain points associated with layers selected for alignment and comparing displacement of those points to ensure that the points fell within a certain tolerance. These scanning processes have historically used a single scan at each of several sites to determine and verify the alignment points of the wafer. These scanning processes also have difficulty finding the alignment points when there was signal distortion in the scanning zone due to extraneous material buildup during layer formation. Increasing the confidence level of the alignment method required making redundant, time consuming scans of the alignment points at each site, or of making single scans at ever increasing numbers of sites. Both approaches are unacceptable time consuming techniques for today's competitive market place. Therefore, it is desirable to have an aligning method with increased accuracy, less scanning time, and that overcomes material build up in the scanning zone as a result of layer formation.

SUMMARY OF THE INVENTION

From the foregoing, it may be appreciated that there continues to be a need for alignment methods that perform a single scan for alignment determination. A need has arisen for an alignment target that can be accurately scanned despite build up of extraneous material in the scanning zone during layer formation. Therefore, a need has arisen for an alignment target with multiple edges to increase alignment accuracy.

In accordance with the present invention, a method of aligning layers in an integrated circuit device is provided which substantially eliminates or reduces disadvantages and problems associated with conventional alignment procedures.

According to an embodiment of the present invention, there is provided a method of aligning layers in an integrated circuit device that includes associating each layer with an alignment target that has at least four edges on a single axis. Each layer and associative alignment target are successively formed onto a semiconductor material. After each layer is formed, the edges of the alignment targets of corresponding aligned layers are measured to determine whether proper layer alignment occurs.

The method of the present invention provides various technical advantages over conventional alignment procedures. For example, one technical advantage is in providing multiple edges in an alignment target to increase alignment accuracy. Another technical advantage is in having multiple edges in an alignment target to overcome scanning signal shifts due to build up of extraneous materials that may occur along one of the edges in the scanning zone during layer formation. Yet another technical advantage is in reducing the number of scanning runs required to determine proper alignment. Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
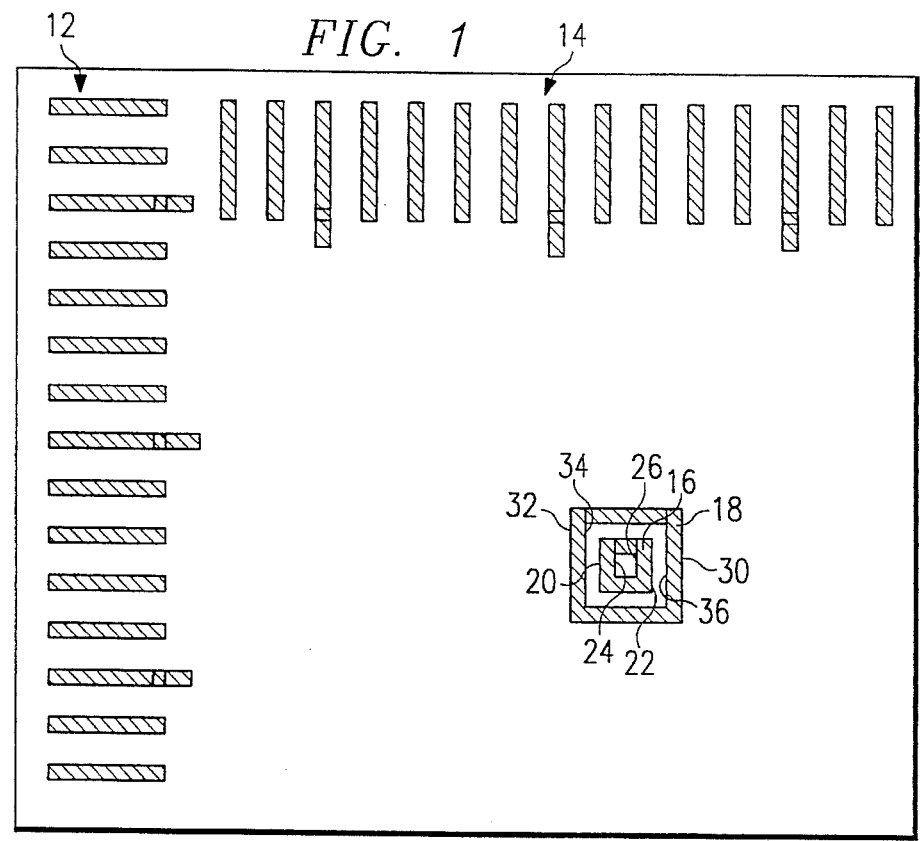
FIG. 1 illustrates a schematic diagram of one half of an alignment target.

FIG. 1 is a schematic diagram of an alignment target 10. Alignment target 10 includes a first set of vernier marks 12 along a vertical plane and a second set of vernier marks 14 along a horizontal plane. Alignment target 10 also includes a first boxed frame 16 and a second boxed frame 18. First boxed frame 16 has outer edges 20 and 22 and inner edges 24 and 26. Second boxed frame 18 has outer edges 30 and 32 and inner edges 34 and 36. Though alignment target 10 is shown to have two boxed frames, a single boxed frame, or multiple boxed frames as space permits, may be used in order to select the desired number of edges for scanning. Also, since any structure that gives a series of edges suitable for scanning may be used, the edges of the alignment target do not have to meet and form a continuous, boxed frame.

Figure 2:
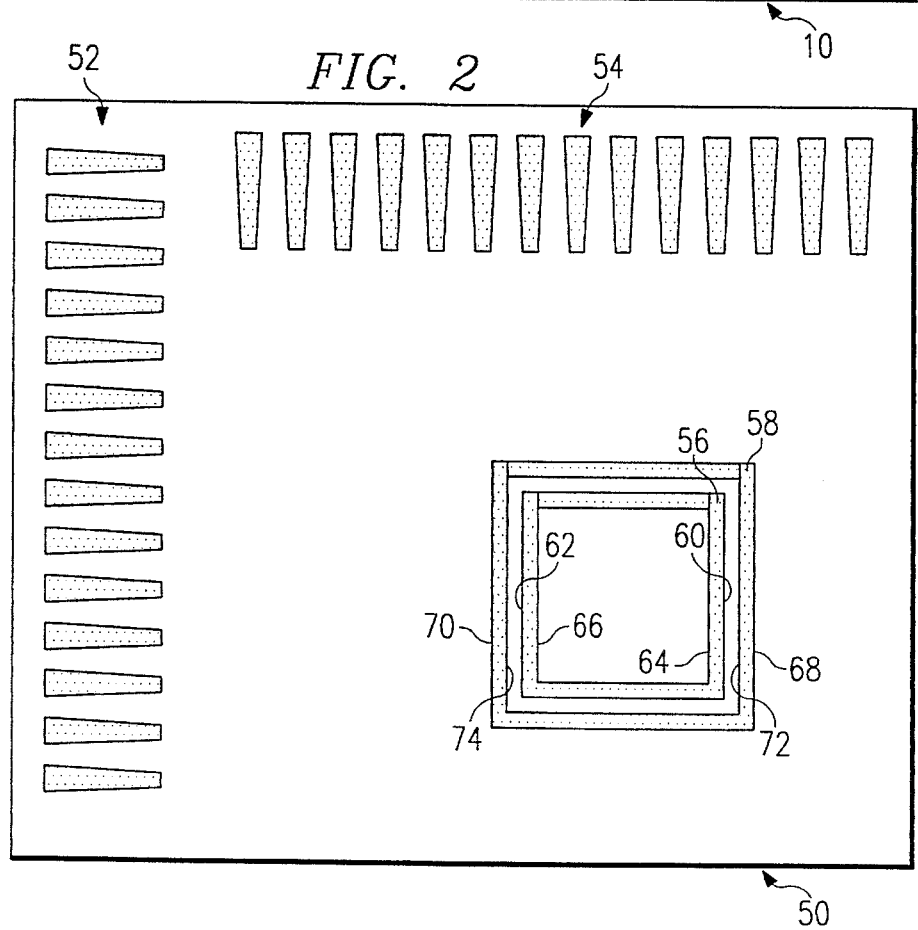
FIG. 2 illustrates a schematic diagram of the other half alignment target for a correspondingly aligned layer.

FIG. 2 is a schematic diagram of an alignment target 50 for a correspondingly aligned layer. Alignment target 50 includes a first set of vernier marks 52 along a vertical plane and a second set of vernier marks 54 along a horizontal plane. Alignment target 50 also includes a third boxed frame 56 and a fourth boxed frame 58. Third boxed frame 56 has outer edges 60 and 62 and inner edges 64 and 66. Fourth boxed frame 58 has outer edges 68 and 70 and inner edges 72 and 74. As with alignment target 10, alignment target 50 may employ a single boxed frame, multiple boxed frames, or any other multiple-edged structure according to space limitations, to select a desired number of edges for scanning. Boxed frames 56 and 58 of alignment target 50 have greater dimensions than boxed frames 16 and 18 of alignment target 10.

Figure 3:
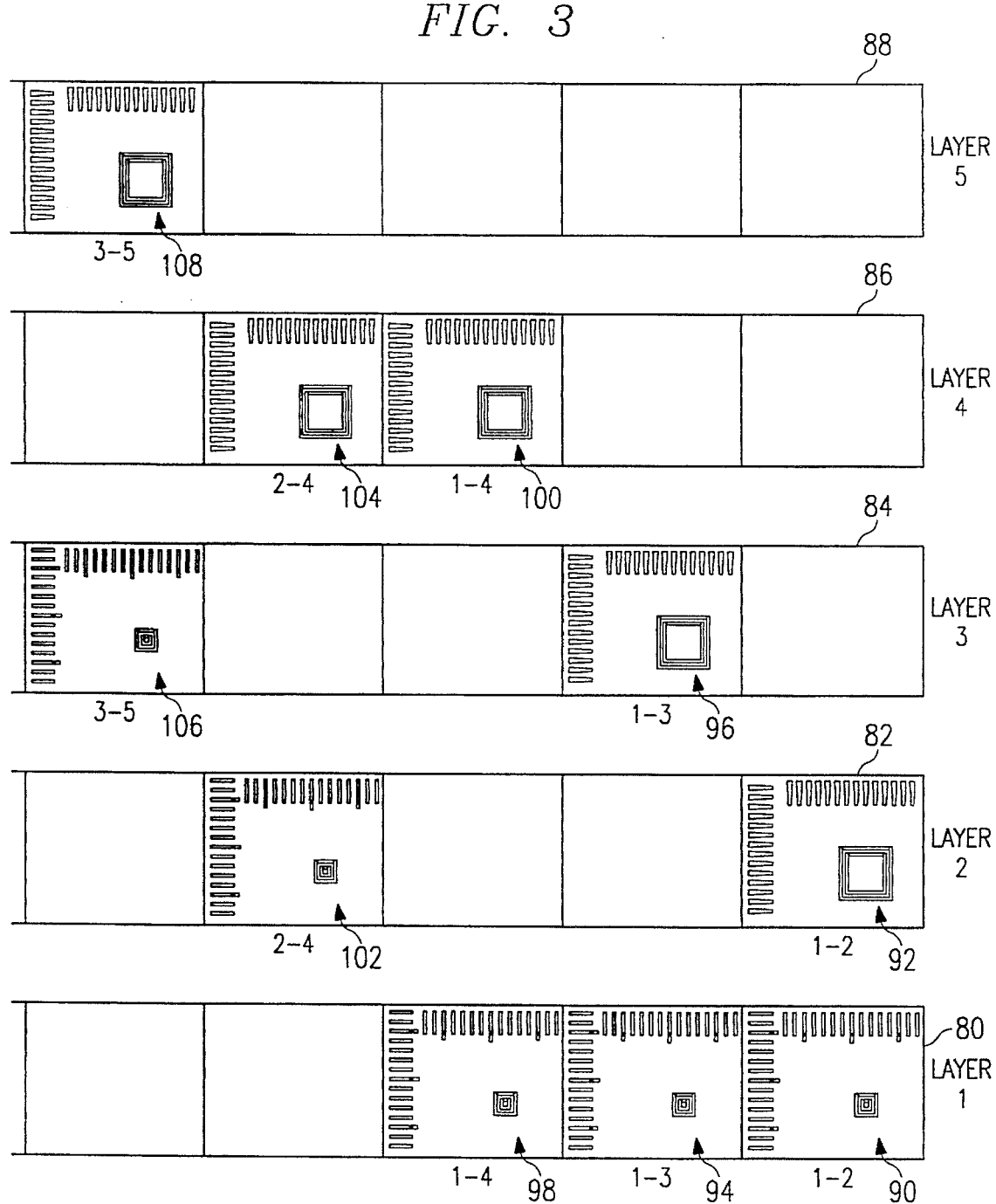
FIG. 3 illustrates a simplified diagram of alignment targets on reticles associated with a series of layers.

FIG. 3 is a simplified diagram of alignment marks on a series of reticles corresponding to a series of layers. Reticle 80 has alignment targets corresponding to layer 1, reticle 82 has alignment targets corresponding to layer 2, reticle 84 has alignment targets corresponding to layer 3, reticle 86 has alignment targets corresponding to layer 4, and reticle 88 has alignment targets corresponding to layer 5. Each reticle has alignment targets that are used to align one layer to one of the other layers as predetermined for the design of the integrated circuit device. For example, reticle 80 for layer 1 has an alignment target 90 that corresponds to an alignment target 92 of reticle 82 for layer 2 to be used when aligning layer 1 with layer 2. Reticle 80 for layer 1 also has an alignment target 94 that corresponds to an alignment target 96 of reticle 84 for layer 3 to be used when aligning layer 1 with layer 3. Reticle 80 for layer 1 also has an alignment target 98 corresponding to an alignment target 100 of reticle 86 for layer 4 to be used when aligning layer 1 with layer 4. Reticle 82 for layer 2 also has an alignment target 102 corresponding to an alignment target 104 of reticle 86 for layer 4 to be used when aligning layer 2 with layer 4. Reticle 84 for layer 3 also has an alignment target 106 that corresponds to an alignment target 108 of reticle 88 for layer 5 to be used when aligning layer 3 with layer 5. Additional alignment targets may be included to align additional layers.

The reticles are used for the formation of each layer during the semiconductor fabrication process. Each reticle is successively applied during the fabrication process to successively form each layer on appropriate portions of a semiconductor wafer. An alignment structure containing the alignment targets is also formed on the semiconductor wafer during the fabrication process. After each layer and corresponding alignment structure is formed on a semiconductor wafer, a scanning process is performed on the alignment targets of correspondingly aligned layers at the alignment structure formed on the semiconductor wafer to determine if proper alignment exists.

Figure 4:
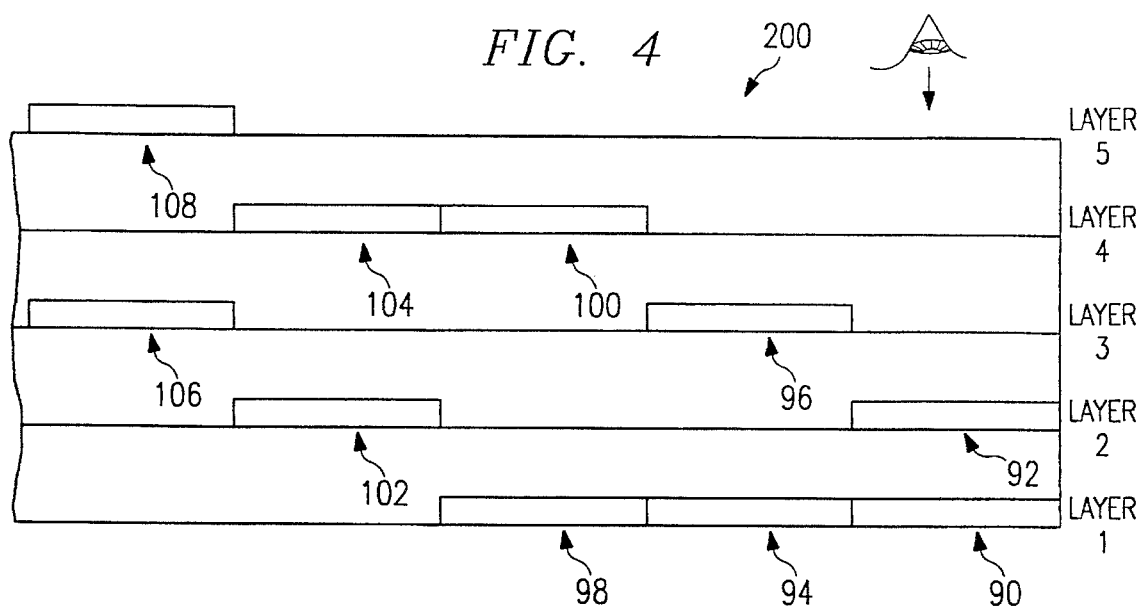
FIG. 4 illustrates a simplified schematic diagram of a side view of an alignment structure formed during fabrication of an integrated circuit device.

FIG. 4 is a simplified cross-sectional diagram of an alignment structure 20 formed on the semiconductor wafer. The alignment structure formed during fabrication of each layer includes the alignment targets according to the reticle associated with each layer. Layer 1 was formed with alignment targets 90, 94, and 98. Layer 2 was formed with alignment targets 92 and 102. Layer 3 was formed with alignment targets 96 and 106. Layer 4 was formed with alignment targets 100 and 104. Layer 5 was formed with alignment target 106. Since materials used in the formation of each layer is transparent or opaque, positive or negative tones of the alignment structure are used on the reticle to allow visual inspection of the alignment targets through the alignment structure.

As previously discussed, conventional alignment techniques were performed on vernier marks associated with each layer such that an operator could visually inspect the vernier marks to determine if the layers have been properly aligned. With the use of alignment targets having multiple edge configurations, more accurate scanning equipment can be used to determine if layers are properly aligned. Vernier marks 12, 14, 52, and 54 remain in the alignment target to allow for optional manual alignment. Though each alignment target is shown as being formed on each corresponding layer, the alignment targets may be etched into the layers such that grooves are created in each layer instead of raised edges that correspond to the boxed frame configuration of the alignment targets.

Figure 5:
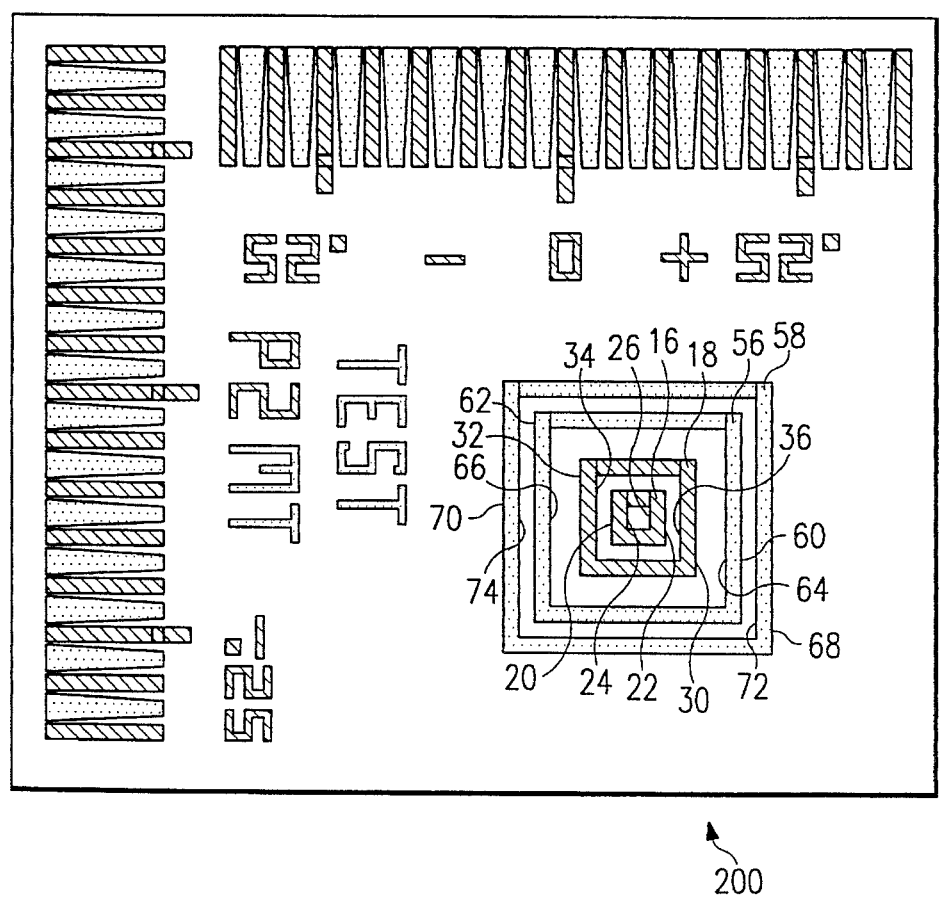
FIG. 5 illustrates a schematic diagram of both halves of an alignment structure seen by a scanning device to determine proper layer alignment.

FIG. 5 is a schematic diagram of one portion of alignment structure 200 having alignment targets for two correspondingly aligned layers. The alignment targets formed within alignment structure 200 for correspondingly aligned layers are scanned to determine if the layers are properly aligned. The scanning process performs a scan on all the frames for the inner and outer boxes at one time. From the scan of inner boxed frames 16 and 18 along an x-axis plane, edges 20, 22, 24, 26, 30, 32, 34, and 36 are found. Processing circuitry takes the information from the scanning process and calculates a center point for the alignment target represented by boxed frames 16 and 18. During the previously discussed scan of the inner boxed frames, the scanning process also performs a scan along the x-axis plane on outer boxed frames 56 and 58 in order to find edges 60, 62, 64, 66, 68, 70, 72, and 74. The processing circuitry calculates a center position for the alignment target of boxed frames 56 and 58 according to the information received from the scanning process. If the center positions of the two alignment targets coincide, then the layers are properly aligned along the x-axis plane. The scanning process is then performed on the alignment targets along the y-axis plane to determine if the calculated center points of each alignment target coincide. If the alignment targets coincide on both the x-axis plane and the y-axis plane, then the layers are properly aligned.

By having multiple edges for which to scan, a single scan can be performed along each axis for each alignment target, reducing the amount of time necessary to obtain equivalent data by performing multiple scans on one or two edges. Further, any error in scanning an edge based on inaccurate readings due to build up of material along any edge during layer formation is overcome by having redundant edges upon which to base the center point calculation. If an edge produces a measurement disproportionate to other edge measurements, then the analysis algorithm can discard that edge for the center point calculation.

In summary, a method of aligning layers of an integrated circuit device include using alignment targets that have multiple edges such as a boxed frame configuration in order to accurately determine proper layer alignment. An alignment structure containing alignment targets for each layer is formed on the semiconductor wafer during device fabrication. A scanning process is performed on the alignment structure to determine if the center points of the alignment targets for correspondingly aligned layers coincide according to the position of the multiple edges of each alignment target. If the center points coincide, then the layers have been properly aligned.

Thus, it is apparent that there has been provided, in accordance with the present invention, a method of aligning layers in an integrated circuit device that satisfies the advantages set forth above. Although the preferred embodiment has been described in detail, it should be understood that various changes, substitutions, and alterations can be made herein without departing from the spirit and scope of the present invention as defined by the following claims.

What is claimed is:

1. A method of aligning multiple layers in an integrated circuit device, the method comprising the steps of:

associating each layer with at least one of a first and a second alignment target, each alignment target having at least four edges on a single plane, wherein the first and the second alignment targets are concentric and have the same structure with different dimensions;

forming on a first layer first alignment targets associated with layers above said first layer and second alignment targets associated with layers below said first layer onto a semiconductor material such that a first alignment target on said first layer is concentrically aligned with a second alignment target on one other layer when the first and the other layer are aligned; and measuring the edges of a first alignment target and a second alignment target to determine when the first and the the second alignment targets are concentrically aligned.

2. The method of claim 1 further including the step of forming the alignment targets in the shape of a boxed frame to produce the four edges.

3. The method of claim 1 wherein said measuring step includes the step of performing the measuring along an x-axis plane and a y-axis plane.

4. The method of claim 1 further comprising the step of:

calculating a center point from the edges of a first and a second alignment targets for each first and other layer to determine whether the center points coincide indicating the first and the second alignment targets are concentrically aligned.

5. The method of claim 4 further comprising the step of:

disregarding an edge during said center point calculating step when the edge has a measurement inconsistent with measurements of related edges of the alignment target.

6. The method of claim 1 wherein the forming step includes the step of etching the alignment targets to create grooves in the semiconductor material.

7. A method of aligning multiple layers in an integrated circuit device, the method comprising the steps of:

placing a set of concentric alignment targets on a reticle, each alignment target having more than two edges along an x-axis plane and a y-axis plane;

associating each layer with a reticle and a corresponding set of alignment targets, said set of alignment targets including first alignment targets associated with a set of targets on a layer above said layer and second alignment targets associated with a set of targets on a layer below said layer, the reticles and concentric alignment of a first alignment target and an associated second alignment on a different layer determining when one layer is aligned to the different layer;

forming each layer and corresponding set of alignment targets on a semiconductor wafer to fabricate the integrated circuit device, the alignment targets forming an alignment structure on the semiconductor wafer;

scanning the alignment structure for correspondingly aligned layers after each layer formation to determine edge locations for each first and associated second concentric alignment target of the correspondingly aligned layers; and calculating a center point for each alignment target of correspondingly aligned layers in response to the edge locations, the correspondingly aligned layers being aligned if the center points coincide.

8. The method of claim 7 further comprising the step of:

discarding an edge location for the center point calculating step if the edge location measured is inconsistent with measurements of other edge locations.

9. The method of claim 7 further including the step of structuring each alignment target to have a boxed frame configuration.

10. The method of claim 7 further including the step of structuring each alignment target to have a first and a second boxed frame configuration to provide multiple redundant edges, the first boxed frame having a larger dimension than the second boxed frame such that the second boxed frame lies within the first boxed frame.

11. The method of claim 7 further including the step of positioning an alignment target of one layer to fall within an alignment target of an aligned different layer in the alignment structure.

12. The method of claim 7 wherein the scanning step is performed along the x-axis plane and the y-axis plane to determine complete layer alignment.

* * * * *